(12) United States Patent
Kim et al.

(10) Patent No.: US 9,192,071 B2
(45) Date of Patent: Nov. 17, 2015

(54) DISPLAY APPARATUS AND METHOD OF MANUFACTURING THE SAME

(71) Applicant: Samsung Display Co. LTD., Gyeonggi-do (KR)

(72) Inventors: Man-Soo Kim, Gyeonggi-do (KR); Tae-Gil Kang, Suwon-si (KR); Jee-Na Lee, Gyeonggi-do (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 389 days.

(21) Appl. No.: 13/755,835

(22) Filed: Jan. 31, 2013

(65) Prior Publication Data
US 2013/0242480 A1    Sep. 19, 2013

(30) Foreign Application Priority Data
Mar. 13, 2012 (KR) .................. 10-2012-0025386

(51) Int. Cl.
| | |
|---|---|
| H05K 5/00 | (2006.01) |
| H05K 7/00 | (2006.01) |
| H05K 7/14 | (2006.01) |
| H05K 13/04 | (2006.01) |
| H05K 5/02 | (2006.01) |
| G02F 1/1333 | (2006.01) |
| G06F 1/16 | (2006.01) |

(52) U.S. Cl.
CPC .......... *H05K 7/14* (2013.01); *G02F 1/133308* (2013.01); *G06F 1/16* (2013.01); *H05K 5/0017* (2013.01); *H05K 5/02* (2013.01); *H05K 13/04* (2013.01); *G02F 2001/133322* (2013.01); *G02F 2201/46* (2013.01); *Y10T 29/49002* (2015.01)

(58) Field of Classification Search
CPC ........... G06F 1/16; G06F 1/1333; G06F 1/18; G02F 1/133308
USPC ........................................ 361/679.01–679.03
See application file for complete search history.

(56) References Cited

U.S. PATENT DOCUMENTS

| | | | |
|---|---|---|---|
| 7,889,286 B2 * | 2/2011 | Yoo ................................ | 349/58 |
| 2005/0231906 A1 * | 10/2005 | Deckers et al. ............... | 361/685 |
| 2009/0237586 A1 * | 9/2009 | Han et al. ....................... | 349/58 |

FOREIGN PATENT DOCUMENTS

| | | |
|---|---|---|
| KR | 10-2007-0037862 A | 4/2007 |
| KR | 10-2009-0047789 | 5/2009 |
| KR | 10-2011-0000916 A | 1/2011 |

* cited by examiner

*Primary Examiner* — Jerry Wu
(74) *Attorney, Agent, or Firm* — F. Chau & Associates, LLC (57) ABSTRACT

A display apparatus includes a display module, a case and a combining member. The display module includes a display panel and a lower receiving container having a first bottom portion through which a hole is formed. The lower receiving container receives the display panel. The case receives the display module and includes a second bottom portion through which a guide rail hole is formed. The case covers at least a portion of the first bottom portion of the lower receiving container. The combining member is inserted into the hole and the guide rail hole to combine the first bottom portion of the lower receiving container and the second bottom portion of the case, and slides in the guide rail hole in a direction substantially parallel with a plane of the second bottom portion. As a result, a bezel and a thickness of the display apparatus can be decreased.

23 Claims, 8 Drawing Sheets

DISPLAY APPARATUS AND METHOD OF MANUFACTURING THE SAME

PRIORITY STATEMENT

This application claims priority under 35 U.S.C. §119 to Korean Patent Application No. 10-2012-0025386, filed on Mar. 13, 2012 in the Korean Intellectual Property Office (KIPO), the contents of which are herein incorporated by reference in their entireties.

TECHNICAL FIELD

Example embodiments of the present invention relate to a display apparatus and a method of manufacturing the display apparatus. More particularly, embodiments of the present invention relate to a display apparatus having a case covering a display module and a method of manufacturing the display apparatus.

DISCUSSION OF THE RELATED ART

A display module includes a display panel, a lower receiving container and an upper receiving container receiving the display panel. The display module is combined with a case covering the display module. Methods of combining the display module and the case have been referred to as a side mounting method and a top mounting method.

In the side mounting method, wherein a side wall of the upper receiving container and the case are combined using screws, there is a limit to how much a width of a bezel can be decreased due to a length of the screw. In addition, in the side mounting method, a space is required at an upper portion and a lower portion of the screw, and thus there is a limit to how much a thickness of a display apparatus can be decreased.

In the top mounting method, wherein the lower receiving container and the case are combined, a combining space is required outside of the bezel, and thus there is a limit to how much the width of the bezel can be decreased.

Thus, a technique and a design which allows for a decrease in the width of the bezel are required.

SUMMARY

Example embodiments of the present invention provide a display apparatus capable of decreasing a width of a bezel, and a method of manufacturing the same.

According to an example embodiment of the present invention, a display apparatus includes a display module, a case and a combining member. The display module includes a display panel and a lower receiving container having a first bottom portion through which a fixing hole is formed. The lower receiving container receives the display panel. The case receives the display module and includes a second bottom portion through which a guide rail hole is formed. The case covers at least a portion of the first bottom portion of the lower receiving container. The combining member is inserted into the fixing hole and the guide rail hole to combine the first bottom portion of the lower receiving container and the second bottom portion of the case. The combining member slides in the guide rail hole in a direction parallel or substantially parallel with a plane of the second bottom portion.

In an embodiment, the guide rail hole may include a passing portion through which at least a head portion of the combining member passes and a sliding portion having a narrower width than a width of the passing portion, in which the combining member slides from the passing portion in the direction parallel or substantially parallel with the plane of the second bottom portion.

In an embodiment, a width of the passing portion is wider than the head portion of the combining member, and a width of the sliding portion is less than the width of the head portion of the combining member.

In an embodiment, the combining member may include a screw or bolt type member for combining the first bottom portion of the lower receiving container with the second bottom portion of the case.

In an embodiment, a nut member is positioned in the first bottom portion of the lower receiving container, and combined with the screw or bolt type member.

In an embodiment, a first threaded portion (e.g., a screw thread) may be formed on the screw or bolt type member and a second threaded portion corresponding to the first threaded portion may be formed on the nut member.

In an embodiment, a first threaded portion (e.g., a screw thread) may be formed on the screw or bolt type member and a second threaded portion corresponding to the first threaded portion may be formed in the fixing hole formed through the first bottom portion of the lower receiving container.

In an embodiment, the combining member may include a cocking member combining the first bottom portion of the lower receiving container with the second bottom portion of the case.

In an embodiment, the display module may further include an upper receiving container combined with the lower receiving container to fix the display panel. A first protrusion portion may be formed on a side wall of the lower receiving container and a first groove into which the first protrusion portion is inserted may be formed on a side wall of the upper receiving container.

In an embodiment, a second protrusion portion may be formed on the side wall of the upper receiving container and a second groove into which the second protrusion portion is inserted may be formed on a side wall of the case.

In an embodiment, a space may be formed between a part of the lower receiving container and the case.

According to an example embodiment of the present invention, there is a provided a method of manufacturing a display apparatus. In the method, a display module is formed by positioning a display panel in a lower receiving container including a first bottom portion in which a fixing hole is formed. A combining member is inserted into the hole to combine the combining member with the lower receiving container. A case including a second bottom portion in which a guide rail hole is formed is combined with the first bottom portion of the lower receiving container by passing at least a portion of the combining member through the guide rail hole and sliding the combining member in the guide rail hole. The second bottom portion covers at least a portion of the first bottom portion of the lower receiving container. In an embodiment, the combining member may be combined with the lower receiving container by inserting a nut member on which a first threaded portion is formed into the fixing hole, and combining a bolt or screw type member with the nut member, the bolt or screw type member including a second threaded portion (e.g., a screw thread) corresponding to the threaded portion.

In an embodiment, the combining member may be combined with the lower receiving container by forming a first threaded portion in the fixing hole and inserting a bolt or screw type member on which a second threaded portion (e.g., a screw thread) corresponding to the first threaded portion is formed into the fixing hole.

In an embodiment, the combining member may be combined with the lower receiving container by disposing a punch member over the first bottom portion of the lower receiving container in which the fixing hole is formed to form a space between the first bottom portion and the punch member and combining a cocking member with the lower receiving container by inserting the cocking member into the hole in a direction facing the punch member.

In an embodiment, the cocking member may include a protrusion portion, and the cocking member may be combined with the lower receiving container by inserting the cocking member into the fixing hole in a vertical direction facing the punch member and bending the protrusion portion near the punch member to position the protrusion portion into the space between the first bottom portion and the punch member.

In an embodiment, the guide rail hole may include a passing portion through which at least a head portion of the combining member passes and a sliding portion having a narrower width than a width of the passing portion in which the combining member slides from the passing portion in a direction parallel or substantially parallel with a plane of the second bottom portion, and the case may be combined with the first bottom portion of the lower receiving container by passing at least the head portion of the combining member through the passing portion to dispose the case under the lower receiving container and sliding the combining member from the passing portion to the sliding portion to fix the combining member to the second bottom portion of the case.

In an embodiment, combining member may be fixed to the second bottom portion of the case by moving the display module in the direction parallel or substantially parallel with the plane of the second bottom portion.

In an embodiment, a first protrusion portion may be formed on a side wall of the lower receiving container and a first groove may be formed on a side wall of an upper receiving container fixing the display panel, and the first protrusion portion may be inserted into the first groove to combine the lower receiving container with the upper receiving container.

In an embodiment, a second protrusion portion may be formed on the side wall of the upper receiving container and a second groove may be formed on a side wall of the case, and the second protrusion portion may be inserted into the second groove to combine the upper receiving container with the case.

According to an embodiment of the present invention, a display apparatus comprises a display panel, a receiving container having a first bottom portion through which a hole is formed, the receiving container receiving the display panel, a case receiving and positioned under the receiving container, the case including a second bottom portion through which a guide rail hole is formed, wherein the guide rail hole includes a first portion having a larger width than a width of a second portion, and a combining member inserted into the hole and the guide rail hole, wherein the combining member includes a head portion and a body portion, the head portion having a width larger the width of the second portion of the guide rail hole, wherein the body portion of the combining member is positioned in the second portion of the guide rail hole, and the head portion of the combining member rests on an outer surface of the second bottom portion adjacent and outside of the second portion of the guide rail hole.

In an embodiment, the hole in the first bottom portion may include a threaded portion.

According to the embodiments of the present invention, a combining member is inserted into a fixing hole formed through a first bottom portion of a lower receiving container and a guide rail hole formed through a second bottom portion of a case, and the combining member slides in the guide rail hole to combine a display module and the case. As a result, a bezel of the display apparatus can be decreased and a thickness of the display apparatus can be decreased.

BRIEF DESCRIPTION OF THE DRAWINGS

The features of the present invention will become more apparent by describing in detailed example embodiments thereof with reference to the accompanying drawings, in which.

DETAILED DESCRIPTION OF EMBODIMENTS

Hereinafter, embodiments of the present invention will be explained in detail with reference to the accompanying drawings.

Figure 1:
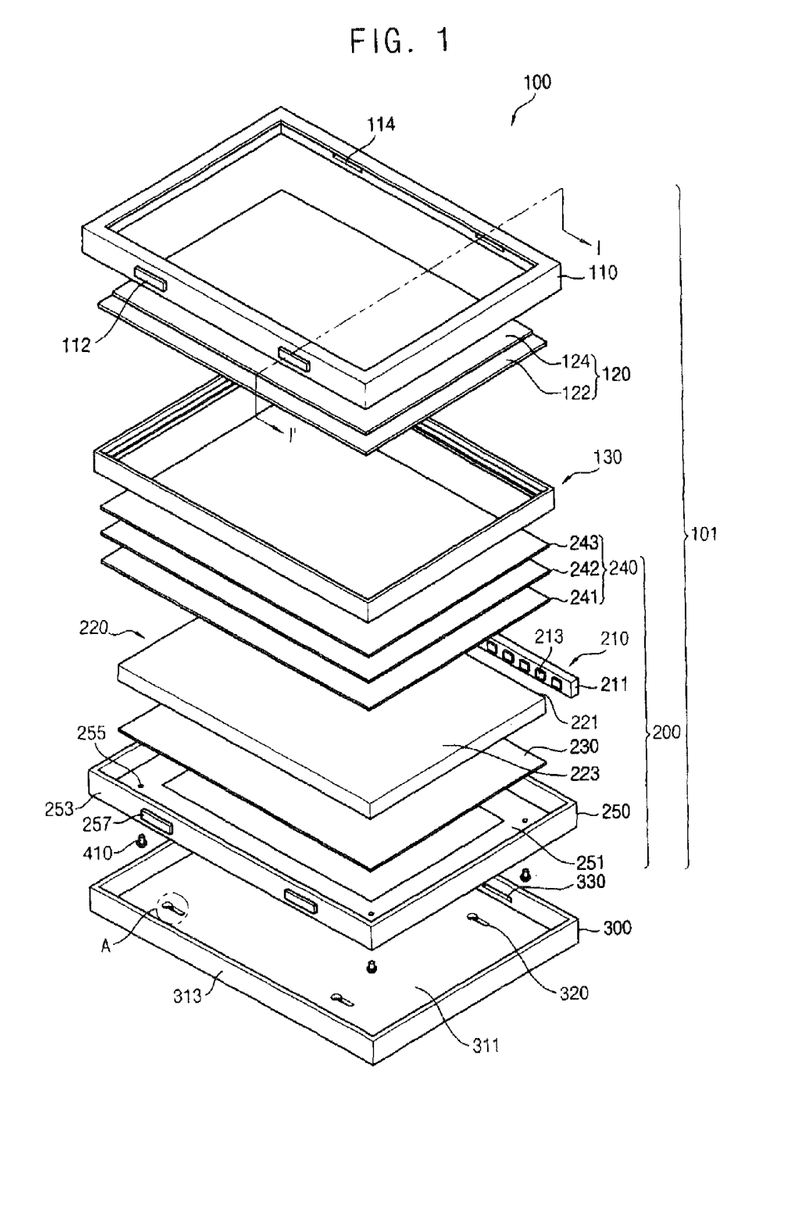
FIG. 1 is an exploded perspective view illustrating a display apparatus according to an example embodiment of the present invention.
Figure 2:
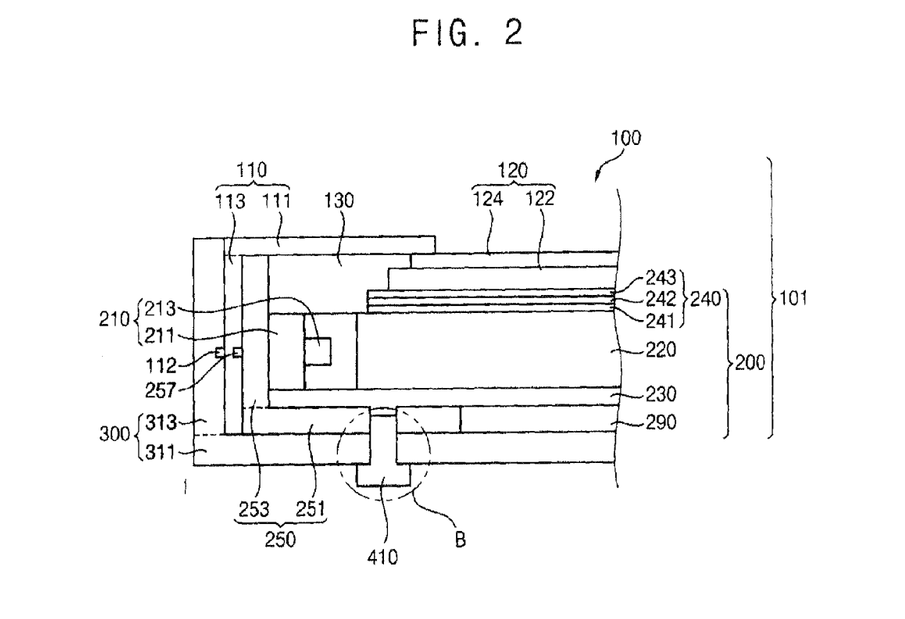
FIG. 2 is a cross-sectional view taken along a line I-I' of FIG. 1.

FIG. 1 is an exploded perspective view illustrating a display apparatus according to an example embodiment of the present invention, and FIG. 2 is a cross-sectional view taken along a line I-I' of FIG. 1.

Referring to FIGS. 1 and 2, the display apparatus 100 according to an example embodiment includes a display module 101, a case 300 and a combining member 410. The display module 101 includes an upper receiving container 110, a display panel 120 and a backlight assembly 200.

The upper receiving container 110 is disposed over the display panel 120 to protect the display panel 120 from external impacts, and a window is formed through the upper receiving container 110 to expose a display area of the display panel 120.

The upper receiving container 110 includes an upper portion 111 and a side wall 113. The upper portion 111 covers a portion of the display panel 120. The side wall 113 extends perpendicular from the upper portion 111 and faces a side wall 253 of a lower receiving container 250. The side wall 113 extends around a perimeter of the upper receiving container 110.

A protrusion portion(s) 112 is formed on an outer surface of the side wall 113 of the upper receiving container 110. A shape of the protrusion portion 112 may be, for example, a hexahedron. According to an embodiment, protrusion portions 112 are formed on opposite long sides of the upper receiving container 110. According to an embodiment, the protrusion portions 112 are formed on the same portions of respective long sides of the upper receiving container 110. Alternatively, the protrusion portions 112 can be formed on opposite short sides of the upper receiving container 110. According to an embodiment, the protrusion portions 112 are formed on the same portions of respective short sides of the upper receiving container 110. According to an embodiment, the protrusion portions 112 can be formed on both the long sides and the short sides.

The protrusion portion 112 can be formed on a central portion of a side wall 113 of the upper receiving container 110. Alternatively, a plurality of the protrusion portions 112 can be formed on a side wall 113 of the upper receiving container 110, spaced apart from each other and at a same distance from the central portion of the side wall 113 of the upper receiving container 110.

A groove(s) 114 is formed on an inner surface of the side wall 113 of the upper receiving container 110.

The display panel 120 includes a thin-film transistor substrate 122, a color filter substrate 124 and a liquid crystal layer (not shown). The thin-film transistor substrate 122 or the color filter substrate 124 may include a color filter. The thin-film transistor substrate 122 includes a first base substrate, a thin-film transistor and a pixel electrode. The color filter substrate 124 faces the thin-film transistor substrate 122. The color filter substrate 124 includes a second base substrate and a common electrode. The liquid crystal layer is between the thin-film transistor substrate 122 and the color filter substrate 124, and liquid crystal of the liquid crystal layer is aligned by an electric field generated between the pixel electrode of the thin-film transistor substrate 122 and the common electrode of the color filter substrate 124. The display panel 120 displays an image using a light exiting from a light exiting surface 223 of a light guide plate 220 of the backlight assembly 200.

The backlight assembly 200 is disposed under the display panel 120 to provide the light to the display panel 120. The backlight assembly 200 includes a light-emitting module 210, the light guide plate 220, a reflection sheet 230, optical sheets 240 and the lower receiving container 250.

The light-emitting module 210 includes a printed circuit board ("PCB") 211 and a light source 213. Signal lines for supplying a driving voltage to the light source 213 are formed on the PCB 211. The light source 213 is mounted on the PCB 211 and receives the driving voltage from the PCB 211 to generate the light. For example, according to an embodiment, the light sources 213 include light emitting diodes ("LEDs"). The PCB 211 can be a metal core PCB ("MCPCB"), which transfers heat generated from the light source 213.

The light guide plate 220 is disposed at a side of the light-emitting module 210. The light guide plate 220 includes a side surface 221 into which light from the light emitting module 210 is incident and a light exiting surface 223 through which the light incident into the side surface exits to the display panel 120.

The reflection sheet 230 is disposed between the light guide plate 220 and the lower receiving container 250, and between the light-emitting module 210 and the lower receiving container 250, to reflect light leaking from the light-emitting module 210 and from the light guide plate 220.

The optical sheets 240 are disposed over the light guide plate 220 to enhance an efficiency of the light exiting from the light guide plate 220. The optical sheets 240 can include a first optical sheet 241, a second optical sheet 242 and a third optical sheet 243, and for example, the first optical sheet 241, the second optical sheet 242 and the third optical sheet 243 can be a diffusion sheet, a prism sheet and a light-condensing sheet, respectively.

The lower receiving container 250 includes a first bottom portion 251 and a side wall 253 extending perpendicularly from the first bottom portion 251. The side wall 253 extends around a perimeter of the lower receiving container 250. The lower receiving container 250 is combined with the upper receiving container 110, and receives the reflection sheet 230, the light guide plate 220, the light-emitting module 210, the optical sheets 240 and the display panel 120.

A fixing hole(s) 255 is formed through the first bottom portion 251. The combining member 410 is inserted into each fixing hole 255.

A protrusion portion(s) 257 is formed on an outer surface of the side wall 253 of the lower receiving container 250. Each protrusion portion 257 is inserted into a corresponding groove 114 formed on the side wall 113 of the upper receiving container 110 to combine the lower receiving container 250 and the upper receiving container 110.

The display apparatus 100 can further include a mold frame 130. The mold frame 130 is disposed between the display panel 120 and the optical sheets 240 to support the display panel 120, and the mold frame 130 fixes the light guide plate 220, the optical sheets 240 and the reflection sheet 230 to the lower receiving container 250.

The case 300 receives the display module 101. The case 300 includes a second bottom portion 311 and a side wall 313. The second bottom portion 311 of the case is disposed under the first bottom portion 251 of the lower receiving container 250 and covers at least a portion of the first bottom portion 251 of the lower receiving container 250. The side wall 313 of the case 300 extends perpendicularly from the second bottom portion 311 and faces the side wall 113 of the upper receiving container 110. The side wall 313 extends around a perimeter of the case 300. According to an embodiment, the case 300 has an 'L' shape in a cross-sectional view.

A guide rail hole(s) 320 is formed through the second bottom portion 311. The combining member 410 that is inserted into the fixing hole 255 of the lower receiving container 250 is inserted into the guide rail hole 320 and slides in the guide rail hole 320.

Figure 3:
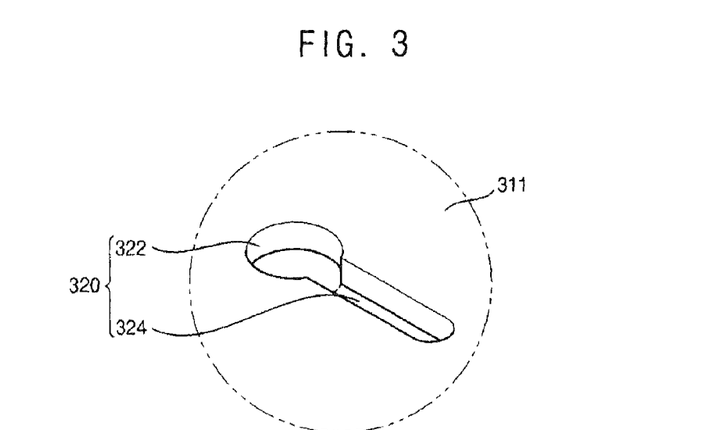
FIG. 3 is a perspective view illustrating a portion 'A' of FIG. 1.

FIG. 3 is a perspective view illustrating a portion 'A' of FIG. 1.

Referring to FIGS. 1 to 3, the guide rail hole 320 formed through the second bottom portion 311 of the case 300 includes a passing portion 322 and a sliding portion 324. Each combining member 410 that is inserted into a guide rail hole 320 can include a head portion and a body portion extending perpendicularly from the head portion.

According to an embodiment, the passing portion 322 has a circular shape corresponding to a shape of the head portion of the combining member 410, and a size of the passing portion 322 is bigger than that of the head portion. Thus, the head portion of the combining member 410 that is inserted into the fixing hole 255 of the lower receiving container 250 passes through the passing portion 322.

The sliding portion 324 extends from the passing portion 322 in a direction parallel with or substantially parallel with a plane of the second bottom portion 311 of the case 300. A width of the sliding portion 324 is less than a diameter of the head portion of the combining member 410. In addition, the width of the sliding portion 324 can be narrower as a distance from the passing portion 322 increases. Thus, the combining member 410 slides from the passing portion 322 to the sliding portion 324 to be fixed to the second bottom portion 311 of the case 300. According to an embodiment, the display module 101 with which the combining member 410 is combined is moved so that the combining member 410 slides from the passing portion 322 to the sliding portion 324.

Referring to FIGS. 1 and 2 again, a groove(s) 330 is formed on an inner surface of the side wall 313 of the case 300. Each groove 330 corresponds to a protrusion portion 112 formed on the upper receiving container 110, and the protrusion portions 112 of the upper receiving container 110 are inserted into respective grooves 330 of the case 300. Thus, the display module 101 and the case 300 can be combined with each other by combining the upper receiving container 110 with the case 300. According to an embodiment, the case 300 includes a material having elasticity so that the protrusion portion 112 of the upper receiving container 110 easily inserted into the groove 330 of the case 300.

According to an embodiment, a space 290 between lower receiving container 250 and the case 300 is formed. As a result of the space 290, the reflection sheet 230 and the optical sheets 240 can be prevented from being damaged, even though the light guide plate 220, the reflection sheet 230 and the optical sheets 240 may be bent.

The combining member 410 combines the display module 101 with the case 300. Specifically, the combining member 410 is inserted into the fixing hole 255 of the lower receiving container 250 and into the guide rail hole 320 of the case 300 to combine the lower receiving container 250 with the case 300. The combining member 410 does not overlap with the side wall 253 of the lower receiving container 250 in the plan view. For example, according to an embodiment, the combining member 410 overlaps with the display panel 120 in the plan view.

Figure 4:
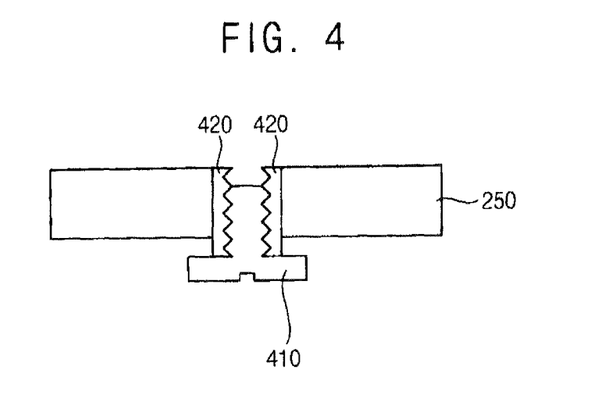
FIG. 4 is an enlarged view illustrating a portion 'B' of FIG. 2.

FIG. 4 is an enlarged view illustrating a portion 'B' of FIG. 2.

Referring to FIGS. 1, 2 and 4, the fixing hole 255 is formed through the first bottom portion 251 of the lower receiving container 250, and a nut member 420 into which the combining member 410 is inserted is formed at the fixing hole 255. For example, the combining member 410 can be a screw or a bolt type member. A screw thread is formed on the combining member 410 and a threaded portion corresponding to the screw thread is formed on the nut member 420. Thus, the combining member 410 can be combined with the nut member 420 formed at the fixing hole 255 of the lower receiving container 250.

Figure 5A:
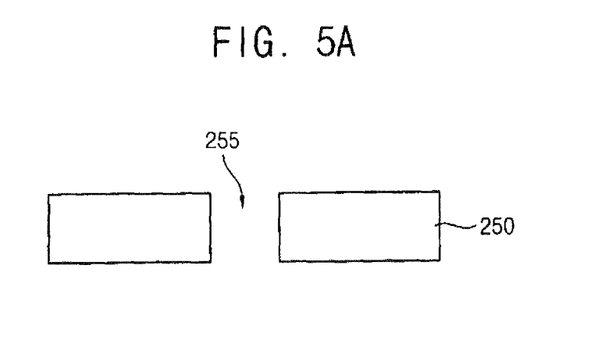
FIGS. 5A to 5C are cross-sectional views illustrating a method of combining a combining member with a lower receiving container as shown in FIG. 4, according to an example embodiment of the present invention.
Figure 5B:
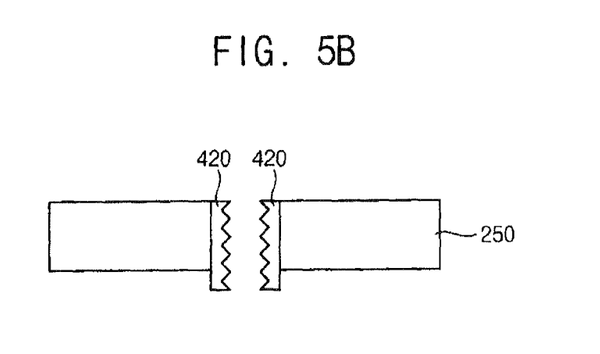
Figure 5C:
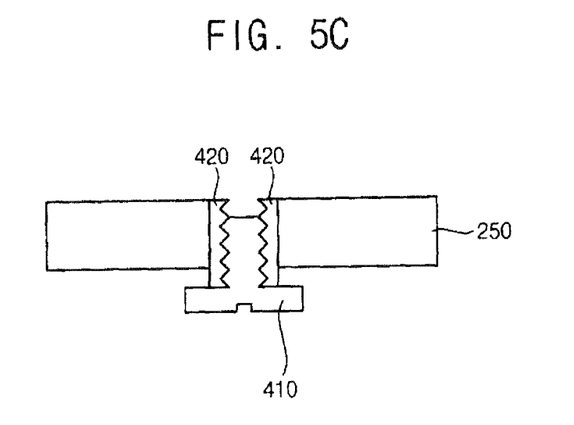

FIGS. 5A to 5C are cross-sectional views illustrating a method of combining of the combining member 410 with the lower receiving container 250 in FIG. 4.

Referring to FIG. 5A, the hole 255 is formed through the first bottom portion 251 of the lower receiving container 250.

Referring to FIG. 5B, the nut member 420 on which the threaded portion is formed is formed at the fixing hole 255.

Referring to FIG. 5C, the combining member 410 is inserted into the nut member 420, by, for example, screwing to the combining member into the nut member 420. Thus, the combining member 410 is combined with the lower receiving container 250.

In the present example embodiment, the nut member 420 is applied to the fixing hole 255. Alternatively, for example, a threaded portion may be formed in a surface of the fixing hole 255 of the lower receiving container 250. Accordingly, a separate nut member 420 would not be required, and the combining member 410 may be inserted directly into the fixing hole 255.

Figure 6A:
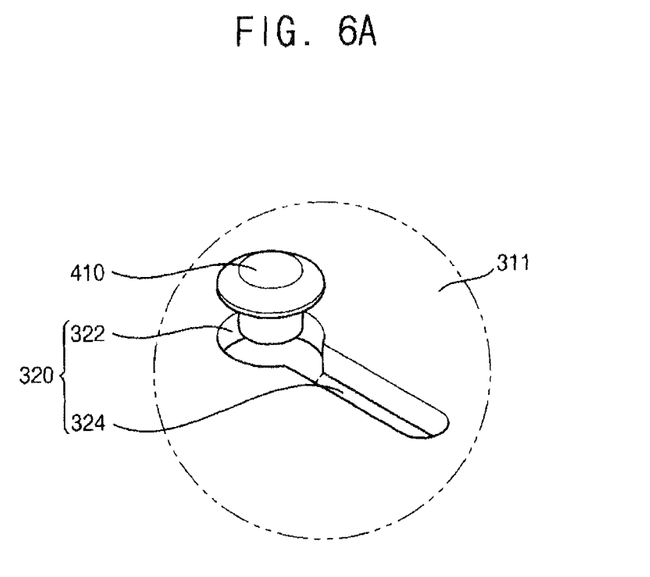
FIGS. 6A and 6B are cross-sectional views illustrating a method of combining the lower receiving container with a case according to an example embodiment of the present invention.
Figure 6B:
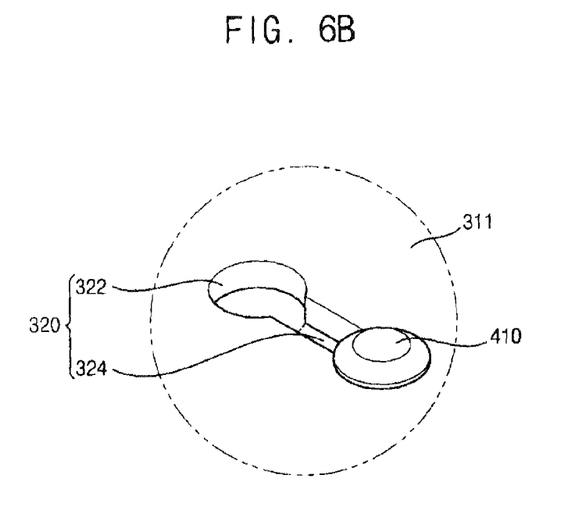

FIGS. 6A and 6B are cross-sectional views illustrating a method of combining the lower receiving container 250 with the case 300 of FIGS. 1 and 2.

Referring to FIGS. 1, 2 and 6A, the second bottom portion 311 of the case 300 is disposed under the first bottom portion 251 of the lower receiving container 250 with which the combining member 410 is combined. Specifically, at least the head portion of the combining member 410, which is already combined with the lower receiving container 250, passes entirely through the passing portion 322 of the guide rail hole 320 to be disposed on the outer surface of the second bottom portion 311 of the case 300.

Referring to FIG. 6B, the combining member 410 slides from the passing portion 322 to the sliding portion 324 in the direction parallel or substantially parallel with the plane of the second bottom portion 311 of the case and the combining member 410 is fixed to the second bottom portion 311. For example, according to an embodiment, a width of the sliding portion 324 becomes narrower in a direction that the combining member 410 slides (i.e., away from the passing portion 322), and the width of the sliding portion 324 is less than the diameter of the head portion of the combining member 410. As a result, the combining member 410 can be fixed to the second bottom portion 311 through which the guide rail hole 320 is formed. In addition, according to an embodiment, at least part of the sliding portion 324 may have a width that is less than the diameter of the body portion of the combining member 410 to create a tight fit of the combining member 410 in the guide rail hole 320. Thus, the lower receiving container 250 and the case 300 can be combined with each other using the combining member 410.

In a method of manufacturing the display apparatus 100 according to the example embodiment illustrated in FIGS. 1 and 2, the display module 101 is formed. For example, the display panel 120, the mold frame 130, the light emitting module 210, the light guide plate 220, the reflection sheet 230 and the optical sheets 240 are received by the lower receiving container 250, and the lower receiving container 250 and the upper receiving container 110 are combined with each other.

The combining member 410 is combined with the lower receiving container 250. Specifically, the fixing hole 255 is formed through the first bottom portion 251 of the lower receiving container 250 as illustrated in FIG. 5A. The nut member 420 on which the threaded portion is formed is inserted into the fixing hole 255 as illustrated in FIG. 5B. The combining member 410 on which the screw thread is formed is inserted into the nut member 420 as illustrated in FIG. 5C.

The lower receiving container 250 and the case 300 are combined with each other using the combining member 410. Specifically, as stated above, at least the head portion of the combining member 410, which is already combined with the lower receiving container 250, entirely passes through the passing portion 322 of the guide rail hole 320 to be disposed on the outer surface of the second bottom portion 311 of the case 300 as illustrated in FIG. 6A. The combining member 410 then slides from the passing portion 322 to the sliding portion 324 and the combining member 410 is fixed to the second bottom portion 311 as illustrated in FIG. 6B. The width of the sliding portion 324 is less than the diameter of the head portion of the combining member 410. As a result, the lower receiving container 250 and the case 300 are combined with each other by the combining member 410.

In the present example embodiment, the lower receiving container 250 and the case 300 are combined with each other after the combining member 410 is combined with the lower receiving container 250, but the invention is not necessarily limited thereto. Alternatively, for example, the combining member 410 can be combined with the lower receiving container 250 by inserting the combining member 410 into the guide rail hole 320 and, then the fixing hole 255, after the case 300 is disposed under the lower receiving container 250.

In addition, according to an embodiment, the lower receiving container 250 and the case 300 are combined with each other after the display panel 120, the mold frame 130, the light emitting module 210, the light guide plate 220, the reflection sheet 230 and the optical sheets 240 are received by the lower receiving container 250, but the invention is not necessarily limited thereto. Alternatively, for example, the display panel 120, the mold frame 130, the light emitting module 210, the light guide plate 220, the reflection sheet 230 and the optical sheets 240 can be received by the lower receiving container 250 after the lower receiving container 250 and the case 300 are combined with each other.

According to an embodiment of the present invention, the combining member 410 is inserted into the fixing hole 255 formed through the first bottom portion 251 of the lower receiving container 250 and the guide rail hole 320 formed through the second bottom portion 311 of the case 300, and the combining member 410 slides in the guide rail hole 320 to combine the display module 101 with the case 300. As a result, a bezel of the display apparatus 100 can be decreased and a thickness of the display apparatus 100 can be decreased.

Figure 7:
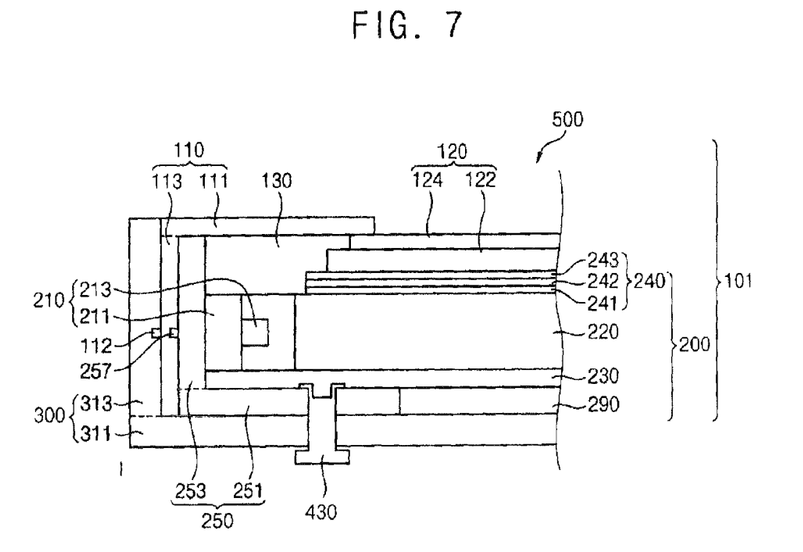
FIG. 7 is a cross-sectional view illustrating a display apparatus according to an example embodiment of the present invention.

FIG. 7 is a cross-sectional view illustrating a display apparatus according to an embodiment of the present invention.

The display apparatus 500 according to the embodiment described in connection with FIG. 7 is substantially the same as the display apparatus 100 according to the embodiment illustrated in FIGS. 1 and 2 except for a combining member 430. Thus, the same reference numerals are used to refer to same or like parts as those described in connection with the embodiment in FIGS. 1 and 2.

Referring to FIG. 7, the display apparatus 500 includes the display module 101, the case 300 and the combining member 430. According to an embodiment, the combining member 430 can be a cocking member that can be combined with the lower receiving container 250. For example, the combining member 430 can be a cocking pen.

FIGS. 8A to 8D are cross-sectional views illustrating a method of combining the combining member 430 with the lower receiving container 250 in FIG. 7.

Figure 8A:
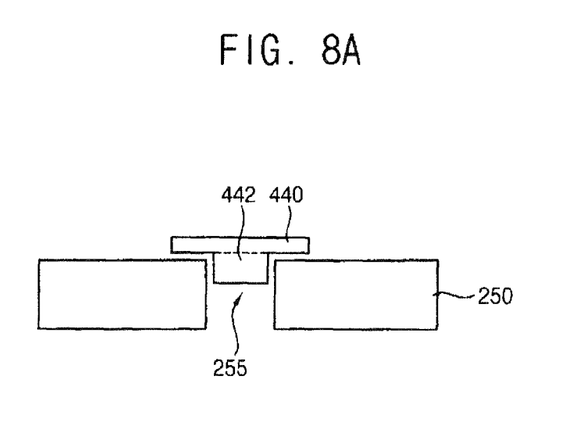
FIGS. 8A to 8D are cross-sectional views illustrating a method of combining a combining member with a lower receiving container in FIG. 7 according to an example embodiment of the present invention.

Referring to FIG. 8A, the fixing hole 255 is formed through the first bottom portion 251 of the lower receiving container 250. A punch member 440 is disposed over the first bottom portion 251 of the lower receiving container 250 which the fixing hole 255 is formed. Specifically, the punch member 440 is disposed over an upper surface of the first bottom portion 251, and a space is formed between the lower receiving container 250 and the punch member 440. According to an embodiment, the punch member 440 includes a protrusion portion 442, and the protrusion portion 442 of the punch member 440 is inserted into the fixing hole 255.

Figure 8B:
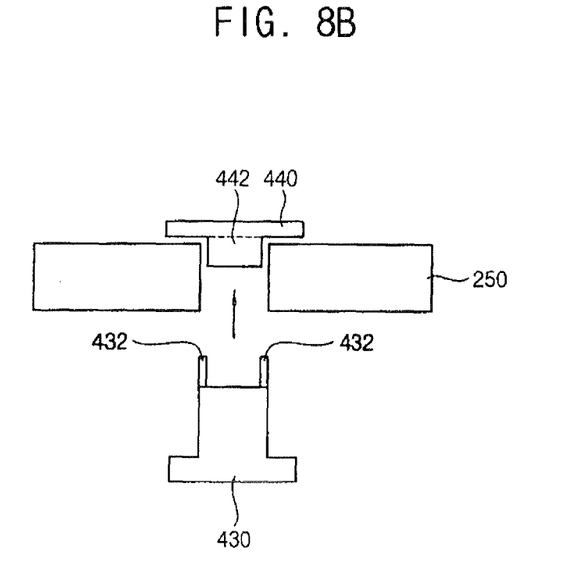

Referring to FIG. 8B, the combining member 430 includes a protrusion portion 432, and the combining member 430 is inserted into the fixing hole 255 in a direction shown by the arrow in FIG. 8B, and faces the punch member 440.

Figure 8C:
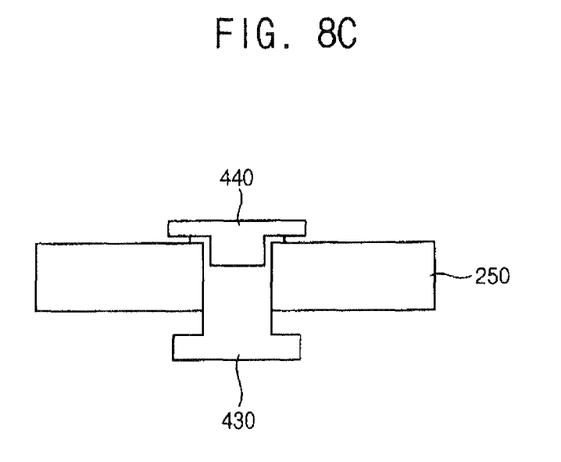

Referring to FIG. 8C, the combining member 430 is combined with the lower receiving container 250 using the punch member 440. Specifically, the protrusion portion 432 of the combining member 430 is bent and inserted into the space between the lower receiving container 250 and the punch member 440 to secure the combining member 430 to the lower receiving container 250.

Figure 8D:
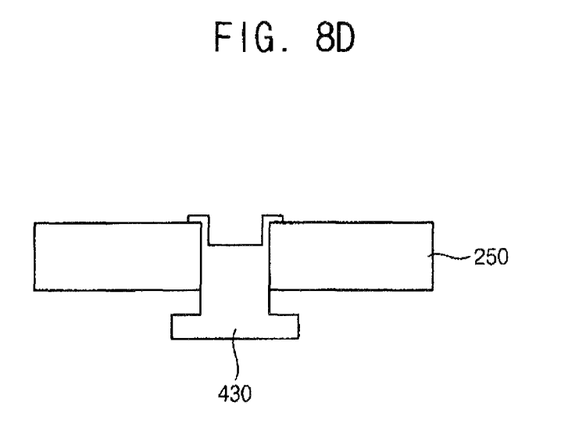

Referring to FIG. 8D, the punch member 440 is removed.

In a method of manufacturing the display apparatus 500 according to the embodiment illustrated in FIG. 7, the combining member 430 is combined with the lower receiving container 250. Specifically, the fixing hole 255 is formed through the first bottom portion 251 of the lower receiving container 250, and the punch member 440 is disposed over the first bottom portion 251 as illustrated in FIG. 8A. The combining member 430 includes the protrusion portion 432, and the combining member 430 is inserted into the fixing hole 255 in a direction to face the punch member 440 as illustrated in FIG. 8B. The protrusion portion 432 of the combining member 430 is bent and positioned in the space between the lower receiving container 250 and the punch member 440 to secure the combining member 430 to the lower receiving container 250 as illustrated in FIG. 8C. The punch member 440 is then removed as illustrated in FIG. 8D.

The lower receiving container 250 and the case 300 are combined with each other using the combining member 430. Specifically, at least the head portion of the combining member 430, which is already combined with the lower receiving container 250, passes through the passing portion 322 of the guide rail hole 320 formed through the second bottom portion 311 of the case 300 to be disposed on an outer surface of the second bottom portion 311. The combining member 430 slides from the passing portion 322 to the sliding portion 324 and the combining member 430 is fixed to the second bottom portion 311. The width of the sliding portion 324 is less than the diameter of a head portion of the combining member 430. As a result, the lower receiving container 250 and the case 300 are combined with each other using the combining member 430.

The display module 101 is formed. For example, according to an embodiment, the display panel 120, the mold frame 130, the light emitting module 210, the light guide plate 220, the reflection sheet 230 and the optical sheets 240 are received by the lower receiving container 250, and the lower receiving container 250 and the upper receiving container 110 are combined with each other.

According to an embodiment, the lower receiving container 250 and the case 300 are combined with each other after the combining member 430 is combined with the lower receiving container 250, but the invention is not necessarily limited thereto. For example, according to an embodiment, the combining member 430 can be combined with the lower receiving container 250 by inserting the combining member 430 into the guide rail hole 320 and the fixing hole 255 after the case 300 is disposed under the lower receiving container 250.

According to an embodiment, the combining member 430 is inserted into the fixing hole 255 formed through the first bottom portion 251 of the lower receiving container 250 and the guide rail hole 320 formed through the second bottom portion 311 of the case 300, and the combining member 430 slides in the guide rail hole 320 to combine the display module 101 with the case 300. As a result, a bezel of the display apparatus 500 can be decreased and a thickness of the display apparatus 500 can be decreased.

Figure 9:
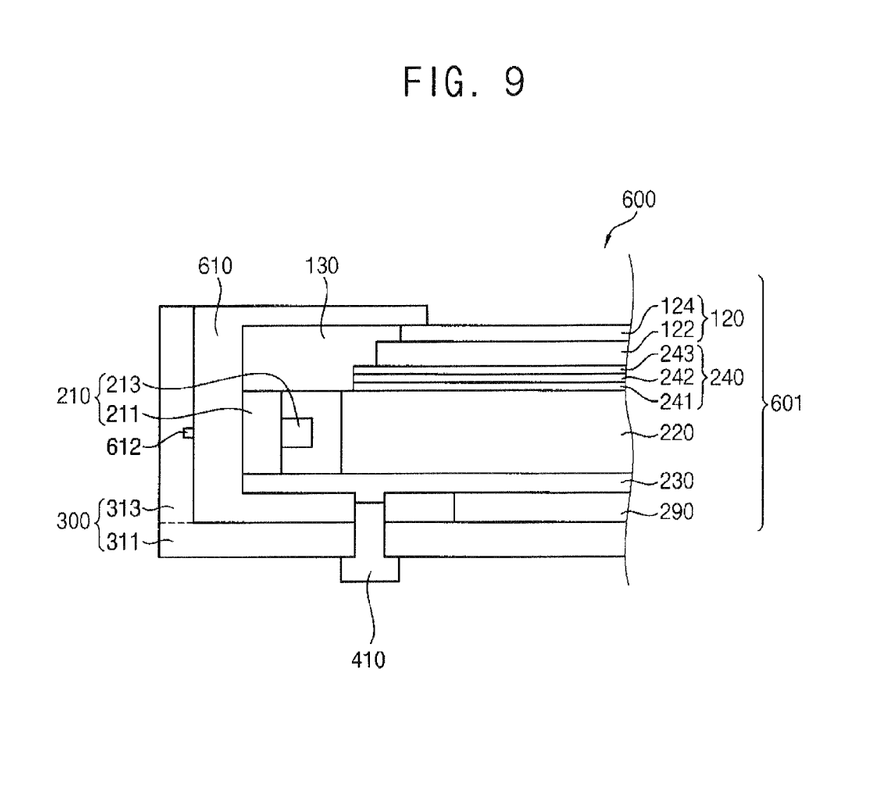
FIG. 9 is a cross-sectional view illustrating a display apparatus according to an embodiment of the present invention.

FIG. 9 is a cross-sectional view illustrating a display apparatus according to an embodiment of the present invention.

The display apparatus 600 according to the embodiment described in connection with FIG. 9 is substantially the same as the display apparatus 100 according to embodiment illustrated in FIGS. 1 and 2 except for a display module 601 having a receiving container 610 and a protrusion portion 612. Thus, the same reference numerals are used to refer to same or like parts as those described in connection with the embodiment in FIGS. 1 and 2.

Referring to FIG. 9, the display apparatus 600 includes the display module 601, the case 300 and the combining member 410.

The display module 601 includes the receiving container 610, the display panel 120, the light emitting module 210, the light guide plate 220, the reflection sheet 230 and the optical sheets 240.

The receiving container 610 has a shape that the upper receiving container 110 and the lower receiving container 250 of FIGS. 1 and 2 are formed in a single body. Thus, the receiving container 610 includes an upper portion, a side wall and a lower portion. The upper portion of the receiving container 610 covers the portion of the display panel 120. The protrusion portion 612 is formed on an outer surface of the side wall of the receiving container 610, and the protrusion portion 612 of the receiving container 610 is inserted into the groove. The lower portion of the receiving container 610 receives the reflection sheet 230, the light guide plate 220, the light-emitting module 210, the optical sheets 240 and the display panel 120.

According to an embodiment of the present invention, the receiving container 610 covering the portion of the display panel 120 to protect the display panel 120 and receiving the reflection sheet 230, the light guide plate 220, the light-emitting module 210, the optical sheets 240 and the display panel 120 is formed in the single body, and thus a structure of the display apparatus 600 may be simplified.

According to embodiments of the present invention, with the display apparatus and the method of manufacturing the display apparatus, a combining member is inserted into a fixing hole formed through a first bottom portion of a lower receiving container and a guide rail hole formed through a second bottom portion of a case. The combining member slides in the guide rail hole to combine a display module and the case. As a result, a bezel and a thickness of the display apparatus can be decreased.

The foregoing is illustrative of embodiments of the present invention and is not to be construed as limiting thereof. Although a few example embodiments of the present invention have been described, those skilled in the art will readily appreciate that many modifications are possible in the example embodiments without materially departing from the teachings of the present invention. Accordingly, all such modifications are intended to be included within the scope of the present invention as defined in the claims.

What is claimed is:

1. A display apparatus comprising:
 a display module including a display panel and a lower receiving container having a first bottom portion through which a hole is formed, the lower receiving container receiving the display panel;
 a case receiving the display module and including a second bottom portion through which a guide rail hole is formed, the case covering at least a portion of the first bottom portion of the lower receiving container; and
 a combining member inserted into the hole and the guide rail hole, wherein the combining member is capable of sliding in the guide rail hole in a direction parallel or substantially parallel with a plane of the second bottom portion, and wherein the combining member overlaps the display panel when viewed in a plan view.

2. The display apparatus of claim 1, wherein the guide rail hole includes a passing portion through which at least a head portion of the combining member passes and a sliding portion having a narrower width than a width of the passing portion in which the combining member slides from the passing portion in the direction parallel or substantially parallel with the plane of the second bottom portion.

3. The display apparatus of claim 2, wherein the width of the passing portion is wider than a width of the head portion of the combining member, and the width of the sliding portion is less than the width of the head portion.

4. The display apparatus of claim 1, wherein the combining member includes a screw or bolt type member.

5. The display apparatus of claim 4, wherein a nut member is disposed in the first bottom portion of the lower receiving container, and wherein the nut member is configured to receive the screw or bolt type member of the combining member.

6. The display apparatus of claim 5, wherein a first threaded portion is formed on the screw or bolt type member of the combining member, and wherein the nut member comprises a second threaded portion corresponding to the first threaded portion.

7. The display apparatus of claim 4, wherein a first threaded portion is formed on the screw or bolt type member and a second threaded portion corresponding to the first threaded portion is formed in the hole formed through the first bottom portion of the lower receiving container.

8. The display apparatus of claim 1, wherein the combining member includes a protrusion portion.

9. The display apparatus of claim 1, wherein the display module further comprises an upper receiving container combined with the lower receiving container, and
 a first protrusion portion is formed on a side wall of the lower receiving container and a first groove into which the first protrusion portion is inserted is formed on a side wall of the upper receiving container.

10. The display apparatus of claim 9, wherein a second protrusion portion is formed on the side wall of the upper receiving container and a second groove into which the second protrusion portion is inserted is formed on a side wall of the case.

11. The display apparatus of claim 1, wherein a space is formed between a part of the lower receiving container and the case.

12. A method of manufacturing a display apparatus, the method comprising:
 forming a display module by positioning a display panel in a lower receiving container including a first bottom portion in which a hole is formed;
 inserting a combining member into the hole to combine the combining member with the lower receiving container; and
 combining a case including a second bottom portion in which a guide rail hole is formed with the first bottom portion of the lower receiving container by passing at least a portion of the combining member through the guide rail hole and sliding the combining member in the guide rail hole, wherein the second bottom portion covers at least a portion of the first bottom portion of the lower receiving container, and wherein the combining member overlaps the display panel when viewed in a plan view.

13. The method of claim 12, wherein combining the combining member with the lower receiving container comprises:
 inserting a nut member on which a first threaded portion is formed into the hole; and combining a bolt or screw type member with the nut member, the bolt or screw type member including a second threaded portion corresponding to the first threaded portion.

14. The method of claim 12, wherein combining the combining member with the lower receiving container comprises:
    forming a first threaded portion in the hole; and
    inserting a bolt or screw type member into the hole, the bolt or screw type member including a second threaded portion corresponding to the first threaded portion.

15. The method of claim 12, wherein combining the combining member with the lower receiving container comprises:
    disposing a punch member over the first bottom portion of the lower receiving container to form a space between the first bottom portion and the punch member; and
    inserting a protrusion portion into the hole in a direction facing the punch member.

16. The method of claim 15, wherein the method further comprises:
    bending the protrusion portion near the punch member to position the protrusion portion in the space between the first bottom portion and the punch member.

17. The method of claim 12, wherein the guide rail hole includes a passing portion through which at least a head portion of the combining member passes and a sliding portion having a narrower width than a width of the passing portion in which the combining member slides from the passing portion in a direction parallel or substantially parallel with a plane of the second bottom portion, and
    wherein combining the case with the first bottom portion of the lower receiving container comprises:
    passing at least the head portion of the combining member through the passing portion to dispose the case under the lower receiving container; and
    sliding the combining member from the passing portion to the sliding portion to fix the combining member to the second bottom portion of the case.

18. The method of claim 17, wherein fixing the combining member to the second bottom portion of the case includes moving the display module in the direction parallel or substantially parallel with the plane of the second bottom portion.

19. The method of claim 12, wherein a first protrusion portion is formed on a side wall of the lower receiving container and a first groove is formed on a side wall of an upper receiving container fixing the display panel, and the method further comprising:
    inserting the first protrusion portion into the first groove to combine the lower receiving container with the upper receiving container.

20. The method of claim 19, wherein a second protrusion portion is formed on the side wall of the upper receiving container and a second groove is formed on a side wall of the case, and the method further comprising:
    inserting the second protrusion portion into the second groove to combine the upper receiving container with the case.

21. A display apparatus comprising:
    a display panel;
    a receiving container having a first bottom portion through which a hole is formed, the receiving container receiving the display panel;
    a case receiving and positioned under the receiving container, the case including a second bottom portion through which a guide rail hole is formed, wherein the guide rail hole includes a first portion having a larger width than a width of a second portion; and
    a combining member inserted into the hole and the guide rail hole, wherein the combining member includes a head portion and a body portion, the head portion having a width larger the width of the second portion of the guide rail hole, wherein the body portion of the combining member is positioned in the second portion of the guide rail hole, and the head portion of the combining member rests on an outer surface of the second bottom portion adjacent and outside of the second portion of the guide rail hole, and wherein the combining member overlaps the display panel when viewed in a plan view.

22. The display apparatus of claim 21, wherein the hole in the first bottom portion includes a threaded portion.

23. A display apparatus comprising:
    a display module including a display panel, an upper receiving container covering a portion of the display panel to protect the display panel and exposed to an outside, and a lower receiving container combined with the upper receiving container and having a first bottom portion through which a hole is formed, the lower receiving container receiving the display panel;
    a case receiving the display module and including a second bottom portion through which a guide rail hole is formed, the case covering at least a portion of the first bottom portion of the lower receiving container; and
    a combining member inserted into the hole and the guide rail hole, wherein the combining member is capable of sliding in the guide rail hole in a direction parallel or substantially parallel with a plane of the second bottom portion, and wherein the combining member overlaps the display panel when viewed in a plan view.

* * * * *